United States Patent [19]
Jones et al.

[11] Patent Number: 5,812,361
[45] Date of Patent: Sep. 22, 1998

[54] DYNAMIC FEEDBACK ELECTROSTATIC WAFER CHUCK

[75] Inventors: Phillip Lawrence Jones; Seyed Jafar Jafarian-Tehrani, both of Fremont; Boris V. Atlas, San Jose; David R-Chen Liu, Saratoga; Ken Edward Tokunaga, Fremont; Ching-Hwa Chen, Milpitas, all of Calif.

[73] Assignee: Lam Research Corporation, Fremont, Calif.

[21] Appl. No.: 624,988

[22] Filed: Mar. 29, 1996

[51] Int. Cl.⁶ .................................................... H02N 13/00
[52] U.S. Cl. ........................... 361/234; 361/235; 279/128
[58] Field of Search ................... 361/233–235; 279/128

[56] References Cited

U.S. PATENT DOCUMENTS

| | | | |
|---|---|---|---|
| 3,993,509 | 11/1976 | McGinty | 148/1.5 |
| 4,184,188 | 1/1980 | Briglia | 361/234 |
| 4,384,918 | 5/1983 | Abe | 156/643 |

(List continued on next page.)

FOREIGN PATENT DOCUMENTS

| | | | |
|---|---|---|---|
| 62-157752 | 7/1987 | Japan | B23Q 3/15 |
| 1-251735 | 10/1989 | Japan | H01L 21/68 |
| 3-3249 | 1/1991 | Japan | H01L 21/68 |
| 3-147843 | 6/1991 | Japan | B32B 18/00 |
| 3-147844 | 6/1991 | Japan | B32B 18/00 |
| 1443215 | 7/1976 | United Kingdom | H02N 13/00 |

OTHER PUBLICATIONS

Daviel, J.F., et al., Electrostatic Clamping Applied to Semiconductor Plasma Processing, I. Theoretical Modeling, Nov. 1993, J. Electrochem. Soc., No. 11.

Wright, D.R., et al., Manufacturing issues of eletrostatic chucks, Jul./Aug. 1995, J. Vac. Sci. Technol. B.

Daviel, J.F., et al., Electrostatic Clamping Applied to Semiconductor Plasma Processing, II. Experimental Results, J. Electrochem, Soc., vol. 140, No. 11, Nov. 1993.

Watanabe, Toshiya, et al., Relationship between Electrical Resistivity and Electrostatic Force and Alumina Electrostatic Chuck, Feb. 1993, Jpn. J. Appl. Phys. vol. 32, pp. 864–871, Part 1, No. 2.

Watanabe, T., et al., Electrostatic charge distribution in the dielectric layer of alumina electrostatic chuck, 1994, Journal of Materials Science 29, pp. 3510–3516.

Field, John, Wafer Handling, Electrostatic wafer clamping for next–generation manufacturing, Sep., 1994, Solid State Technology.

Unknown, "*Patent Abstracts of Japan*", vol. 095, No. 002, & JP 06 326176A, Tokyo Electron, Ltd., Nov. 25, 1994 (Publication Date).

(List continued on next page.)

*Primary Examiner*—Fritz Fleming
*Attorney, Agent, or Firm*—Beyer & Weaver, LLP

[57] ABSTRACT

An electrostatic chuck system having an electrostatic chuck for securely holding a wafer on a surface of the electrostatic chuck. The electrostatic chuck system comprises a wafer bias sensor coupled to a first portion of the electrostatic chuck for sensing an alternating current signal at the first portion. The wafer bias sensor outputs, responsive to the alternating current signal, a direct current voltage level representative of a direct current bias level of the wafer. The electrostatic chuck system further comprises a variable electrostatic chuck power supply coupled to the wafer bias sensor. The variable electrostatic chuck power supply provides a first potential level to the first portion of the electrostatic chuck. The first potential level is modified, responsive to the direct current voltage level, to substantially maintain a first predefined potential difference between the first portion of the electrostatic chuck and a first region of the wafer overlaying the first portion irrespective of a magnitude of the direct current bias level of the wafer.

23 Claims, 8 Drawing Sheets

U.S. PATENT DOCUMENTS

| | | | |
|---|---|---|---|
| 4,431,473 | 2/1984 | Okano et al. | 156/345 |
| 4,464,223 | 8/1984 | Gorin | 156/643 |
| 4,502,094 | 2/1985 | Lewin et al. | 361/234 |
| 4,554,611 | 11/1985 | Lewin | 361/234 |
| 4,579,618 | 4/1986 | Celestino et al. | 156/345 |
| 4,645,218 | 2/1987 | Ooshio et al. | 279/1 M |
| 4,665,463 | 5/1987 | Ward et al. | 361/234 |
| 4,692,836 | 9/1987 | Suzuki | 361/234 |
| 4,724,510 | 2/1988 | Wicker et al. | 361/234 |
| 4,842,683 | 6/1989 | Cheng et al. | 156/345 |
| 4,897,171 | 1/1990 | Ohmi | 204/298 |
| 4,962,441 | 10/1990 | Collins | 361/234 |
| 4,983,254 | 1/1991 | Fujimura et al. | 156/643 |
| 5,055,964 | 10/1991 | Logan et al. | 361/234 |
| 5,103,367 | 4/1992 | Horwitz et al. | 361/234 |
| 5,104,834 | 4/1992 | Watanabe et al. | 501/127 |
| 5,110,438 | 5/1992 | Ohmi et al. | 204/298.34 |
| 5,117,121 | 5/1992 | Watanabe et al. | 307/130 |
| 5,151,845 | 9/1992 | Watanabe et al. | 361/324 |
| 5,160,152 | 11/1992 | Toraguchi et al. | 279/128 |
| 5,179,498 | 1/1993 | Hongoh et al. | 361/234 |
| 5,191,506 | 3/1993 | Logan et al. | 361/234 |
| 5,325,261 | 6/1994 | Horwitz | 361/234 |
| 5,326,725 | 7/1994 | Sherstinsky et al. | 437/225 |
| 5,350,479 | 9/1994 | Collins et al. | 156/345 |
| 5,459,632 | 10/1995 | Birang et al. | 361/234 |
| 5,463,525 | 10/1995 | Barnes et al. | 361/234 |
| 5,467,249 | 11/1995 | Barnes et al. | 361/234 |
| 5,535,507 | 7/1996 | Barnes et al. | 361/234 |
| 5,557,215 | 9/1996 | Saeki et al. | 324/765 |
| 5,561,585 | 10/1996 | Barnes et al. | 361/234 |
| 5,587,045 | 12/1996 | Keller et al. | 156/627.1 |
| 5,665,166 | 9/1997 | Deguchi et al. | 118/723 E |

OTHER PUBLICATIONS

Unknown, "*Patent Abstracts of Japan*", vol. 18, No. 599 (E–1631), & JP 06 232089A, Tokyo Electron, Ltd., Aug. 19, 1994 (Publication Date).

Yunju Ra and Ching–Hwa Chen, "Direct current bias as an ion current monitor in the transformer coupled plasma etcher", vol. 11, No. 6, Nov. 1, 1993, pp. 2911–2913, Journal of Vacuum Science and Technology, Woodbury, NY.

DYNAMIC FEEDBACK ELECTROSTATIC WAFER CHUCK

BACKGROUND OF THE INVENTION

The present invention relates to the manufacture of semiconductor devices. More specifically, the present invention relates to methods and apparatuses for securely clamping a semiconductor wafer on an electrostatic (ESC) chuck of a plasma processing chamber during wafer processing.

Plasma-enhanced semiconductor processes for etching, oxidation, annodization, chemical vapor deposition (CVD), or the like are known. For illustration purposes, FIG. 1A shows a representative plasma processing system 100 having a plasma processing chamber 102. Above chamber 102, there is disposed an electrode 103, which is implemented by a coil in the example of FIG. 1. Coil 103 is energized by a RF generator 105, typically via a matching network (not shown in FIG. 1A).

Within chamber 102, there is provided a shower head 104, which preferably includes a plurality of holes for releasing gaseous source materials into the RF-induced plasma region between itself and a wafer 108. In one embodiment, shower head 104 is made of quartz although it may also be made of other suitable materials and may be left either electrically floating or grounded. Wafer 108 is disposed on a chuck 110, which acts as a second electrode and is preferably biased by a radio frequency generator 120 (also typically via a matching network). To provide a path to ground, the chamber wall of chamber 102 is typically grounded.

FIG. 1A is included herein to illustrate a representative, simplified plasma-enhanced processing system for the purpose of introducing the background to the present invention. As is known to those skilled in the art, variations in the designs of plasma processing systems exist. By way of example, FIG. 1B illustrates a variant of the plasma processing system of FIG. 1A wherein a single RF generator 150 is employed to supply (via switching circuit 152) RF power to either chuck 110 or shower head 104 (and grounding the other). In the case of FIG. 1B no coil is employed, and shower head 104 acts as an electrode when energized by RF generator 150.

To ensure uniform and repeatable etching and deposition of materials, it is desirable that the temperature of wafer 108 be accurately controlled during plasma processing. Control of the wafer temperature is typically accomplished by introducing a heat-exchange gas, typically one of the noble gases such as helium, underneath the wafer into the wafer/chuck interface. In the plasma processing systems of FIGS. 1A and 1B, for example, helium is introduced via port 112 into the region between wafer 108 and chuck 110.

To provide an adequate heat transfer medium between the wafer and the chuck, a helium pressure of 5–15 Torr is typically required. Since the ambient pressure within chamber 102 is relatively low, typically around 5 milliTorr–500 milliTorr (mT), a clamping mechanism is usually necessary to secure wafer 108 on chuck 110. Clamping also minimizes the helium leakage around the underside of the wafer to maintain an acceptable helium pressure and achieve satisfactory heat transfer.

One prior art method for clamping a wafer onto a chuck is electrostatic clamping. In electrostatic clamping, an electrostatic chuck is electrically biased relative to the wafer to generate an electrostatic force between the chuck and the wafer. The electrostatic force holds the wafer to the chuck to minimize helium leakage, thereby improving heat transfer.

FIG. 2 illustrates a simple monopolar or unipolar electrostatic chuck 200. The electrostatic chuck of FIG. 2 is called a monopolar chuck since it is biased at a single polarity, i.e., either positively or negatively, during use. A dielectric layer 202, formed of a suitable dielectric material such as polymer or ceramic, is disposed above monopolar chuck 200 and is typically provided with chuck 200 as a single unit. During processing, wafer 108 is disposed atop chuck 200 and is separated therefrom by dielectric layer 202.

When the plasma is turned on in the plasma processing chamber, wafer 108 becomes negatively charged by the plasma, as is well known. By turning on power supply 201 to create a potential difference between chuck 200 and the negatively charged wafer, e.g., by biasing the chuck positively, an electrostatic force is created to securely clamp wafer 108 onto chuck 200.

FIG. 3A is a cross-sectional illustration of a bipolar electrostatic chuck. As the name implies, bipolar electrostatic chuck 302 of FIG. 3A has two poles: a positive pole 304 and a negative pole 306. For ease of illustration, bipolar chuck 302, is arranged in a configuration commonly known as "donut-and-base." This configuration is more clearly illustrated in FIG. 3B. It should be borne in mind, however, that the invention disclosed herein is not limited to this configuration and applies to any one of the known or suitable bipolar chuck configurations.

Above the poles of the bipolar electrostatic chuck, there is disposed a dielectric layer 202, which may be made of any suitable dielectric material such as ceramic, polymer, or the like. Wafer 108 is then placed on top of this dielectric layer 202 of the bipolar ESC chuck for processing.

When power supply 310 is turned on, negative pole 306 is negatively biased by a power supply 310 relative to the common reference potential level. Power supply 310 also biases positive pole 304 positively relative to the common reference potential level. For a p-type semiconductor wafer, the presence of a negative potential on negative pole 306 electrostatically induces the positive charges or holes in wafer 108 to move toward the wafer region overlaying negative pole 306. Conversely, for an n-type semiconductor wafer, electrons in wafer 108 migrate toward the wafer region overlaying positive pole 304. As a result, electrostatic forces between the poles and their respective overlaying wafer regions are created to provide the clamping forces required to keep wafer 108 clamped to bipolar electrostatic chuck 302 during processing.

If the poles are biased equally with opposite polarities relative to a common reference voltage level, an imbalance in the electrostatic forces over the poles may occur when the plasma is turned on and the wafer becomes biased negatively. To illustrate this condition, consider the case where power supply 310 biases positive pole 304 at +350 V and negative pole 306 at –350 V relative to the common reference voltage level. With the plasma off, the wafer potential is at 0 V relative to the common reference voltage level, and the potential differences between the poles of bipolar chuck 302 and their overlaying wafer regions are +350 V and –350 V respectively.

When wafer 108 is negatively charged due to the presence of plasma, however, the potential differences between the wafer and the two poles of the bipolar electrostatic chuck become asymmetric. For example, the wafer bias voltage may be –100 V when the plasma is turned on. In this case, the potential difference between the positive pole and the negatively biased wafer is increased to +450 V, i.e., (+350 V–(–100 V)). However, the potential difference between the negative pole and the negatively biased wafer is decreased to only –250 V, i.e., (–350 V–(–100 V)). Thus the electrostatic holding force between the negative pole and the wafer will be weakened. Consequently, some heat-exchange gas may escape, resulting in inadequate temperature control and/or process variations.

Further, the plasma-induced negative wafer bias may unduly increase the potential difference between the negatively-biased wafer and the positive pole of the bipolar chuck. An excessively high potential difference may cause arcing, i.e., sparking, between the lower surface of the wafer and the upper surface of the chuck, resulting in pit mark damage. Over time, the surface of the chuck may be damaged to the point where it becomes impossible to keep the heat-exchange gas properly sealed. Note that this arcing problem may also occur in a monopolar chuck system when the potential difference between the monopolar chuck and the negatively biased wafer becomes excessively large.

If the d.c. bias potential is substantially constant during plasma processing, it may be possible to compensate for this imbalance by appropriately modifying, in a static manner, the voltage levels supplied to the chuck. For example, the positive pole in a bipolar chuck may be biased less positively with respect to the common reference voltage level to substantially eliminate the above-mentioned electrostatic force imbalance and to reduce the risk of electrostatic arcing. A technique for modifying the voltage levels supplied to the chuck is disclosed in the commonly assigned U.S. patent application entitled "Negative Offset Bipolar Electrostatic Chucks" Ser. No. 08/550,510, filed on Oct. 30, 1995 (Attorney Docket No. P168/LAM1P004). In a monopolar system, e.g., the system shown in FIG. 2, the entire chuck may be biased less positively to account for the negative bias level of the wafer when plasma is present.

However, the d.c. bias potential of a given wafer does not stay constant during processing and may in fact vary from process step to process step. Consequently, the variations in the potential differences between the wafer and the chuck and the electrostatic forces generated thereby cannot be eliminated by biasing of the chuck's power supply in a static manner.

In view of the foregoing, what is desired is an improved method and apparatus for clamping a wafer to its electrostatic chuck during plasma processing that will be able to respond in a real time manner to the dynamic nature of the plasma process.

SUMMARY OF THE INVENTION

The invention relates, in one embodiment, to an electrostatic chuck system having an electrostatic chuck for securely holding a wafer on a surface of the electrostatic chuck. The electrostatic chuck system comprises a wafer bias sensor coupled to a first portion of the electrostatic chuck for sensing an alternating current signal at the first portion. The wafer bias sensor outputs, responsive to the alternating current signal, a direct current voltage level representative of a direct current bias level of the wafer.

The electrostatic chuck system further comprises a variable electrostatic chuck power supply coupled to the wafer bias sensor. The variable electrostatic chuck power supply provides a first potential level to the first portion of the electrostatic chuck. The first potential level is modified, responsive to the direct current voltage level, to substantially maintain a first predefined potential difference between the first portion of the electrostatic chuck and a first region of the wafer overlaying the first portion irrespective of a magnitude of the direct current bias level of the wafer.

In another embodiment, the invention relates to a method for clamping a wafer on a surface of an electrostatic chuck. The method comprises the step of sensing a first alternating current signal at a first portion of the electrostatic chuck and the step of deriving, responsive to the first alternating current signal, a direct current voltage level representative of a direct current bias level of the wafer. Further, the method comprises the step of modifying, responsive to the direct current voltage level, a first potential level supplied by a direct current power supply to the first portion of the electrostatic chuck to substantially maintain a predefined potential difference between the first portion of the electrostatic chuck and a first region of the wafer overlaying the first portion irrespective of a magnitude of the direct current bias level of the wafer.

These and other advantages of the present invention will become apparent upon reading the following detailed descriptions and studying the various figures of the drawings.

DETAILED DESCRIPTION OF THE PREFERRED EMBODIMENTS

An invention is described for dynamically inferring the wafer d.c. bias level and modifying, responsive to the inferred wafer d.c. bias level, the potential levels supplied by an electrostatic chuck (ESC) power supply to the ESC chuck pole(s). In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

Figure 4:
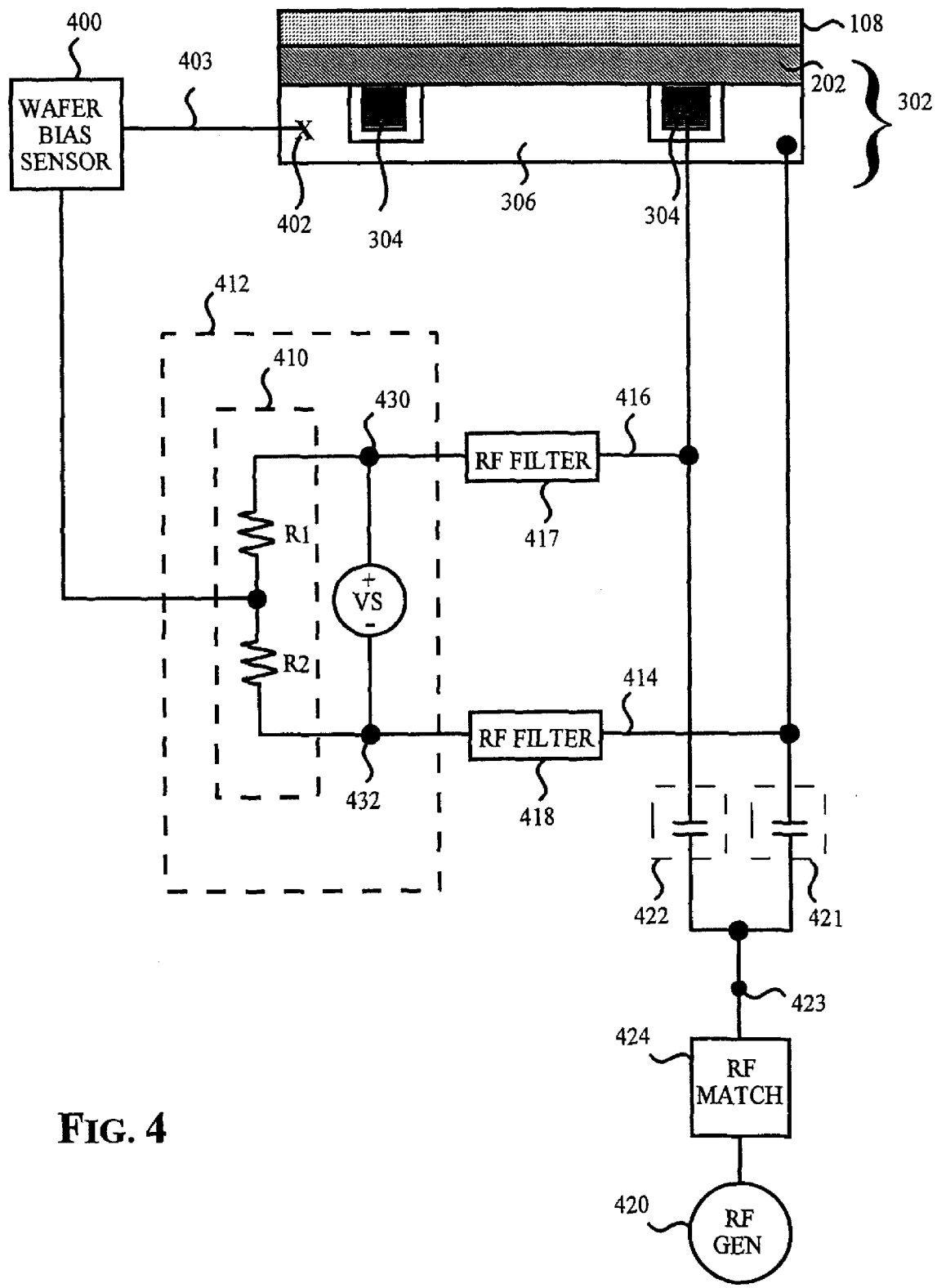
FIG. 4 schematically illustrates an exemplary embodiment of the dynamic feedback bipolar electrostatic (ESC) chuck system in accordance with one aspect of the present invention.

FIG. 4 schematically illustrates an exemplary embodiment of the dynamic feedback electrostatic (ESC) chuck system in accordance with one aspect of the present invention. The ESC chuck system of FIG. 4 is said to be in a dynamic feedback configuration since the wafer d.c. bias level is dynamically inferred and employed to modify the potential levels supplied by the ESC power supply to the ESC chuck poles. Although a bipolar ESC chuck is shown in this schematic illustration, the dynamic feedback concept applies, as will be shown later in a subsequent FIG. 9, equally well to a monopolar ESC chuck.

Referring now to FIG. 4, there is shown a bipolar ESC chuck 302, which comprises a donut portion 304 and a base portion 306. As is conventional, bipolar ESC chuck 302 is energized by an RF generator 420 through a match circuit 424, which serves to maximize the power transfer from RF generator 420 to the plasma. The RF peak-to-peak voltage ($V_{PK-PK}$) is sensed by a wafer bias sensor (WBS) 400 at a predefined measuring point 402 on the ESC chuck through a conductor 403. Point 402 is preferably located at the base portion 306 of bipolar ESC chuck 302 although it may also be located anywhere on the chuck, e.g., at the donut portion 304. Preferably, point 402 is located at a chuck location that is not exposed to the plasma environment. In this manner, the RF peak-to-peak voltage may be sensed without jeopardizing the long-term survivability of conductor 403 by not exposing it to the highly reactive plasma environment. The absence of a wafer bias sensor contact, e.g., conductor 403, from the plasma processing chamber also minimizes any potential for contamination.

In accordance with one aspect of the present invention, the measured RF peak-to-peak voltage, which is an a.c. signal, is then converted to a d.c. voltage level by wafer bias sensor 400. It has been found that the d.c. bias voltage of the wafer, $V_{DC-W}$, is related to the peak-to-peak voltage ($V_{PK-PK}$) measured at the ESC chuck by the following equation:

$$V_{DC-W} \cong (V_{PK-PK}/2) + 2V_{PL} \quad \text{(Eq. 1)}$$

where $V_{PL}$ represents the plasma voltage and $V_{DC-W}$ represents the d.c. bias voltage of the wafer when RF power is applied to the chuck and plasma is present in the plasma processing chamber.

For a typical plasma processing environment, the plasma voltage $V_{PL}$ may be around 20–70 volts. In contrast, the peak-to-peak voltage supplied by the RF source to the chuck ($V_{PK-PK}$) is typically much greater, e.g., up to 2,000 volts and more typically around 300–1500 volts. Since the plasma voltage $V_{PL}$ is much smaller than the peak-to-peak voltage measured on the chuck ($V_{PK-PK}$), the approximated d.c. bias voltage of the wafer ($V_{DC-WA}$) may be approximately represented by the following relationship when the plasma voltage $V_{PL}$ is ignored:

$$V_{DC-WA} \cong (V_{PK-PK}/2) \quad \text{(Eq. 2)}$$

It follows from Eq. 2 that the approximated d.c. bias voltage of the wafer, $V_{DC-WA}$, can be inferred indirectly and with reasonable accuracy from the chuck's measured peak-to-peak voltage, $V_{PK-PK}$.

The function of the wafer bias sensor circuit (WBS) 400 is to derive the aforementioned approximated wafer d.c. bias voltage ($V_{DC-WA}$) from the RF peak-to-peak voltage measured on the ESC chuck. This approximated wafer d.c. voltage ($V_{DC-WA}$) may then be used as a feedback voltage into the variable ESC power supply 412 to modify the potential levels supplied to the two poles, e.g., poles 304 and 306, of the bipolar ESC chuck.

In the example of FIG. 4, the approximated wafer d.c. bias voltage ($V_{DC-WA}$) is supplied to a balanced bridge 410 of variable ESC power supply 412 to adjust the potential levels supplied to base portion 306 and donut portion 304 (via conductors 414 and 416 respectively). Balanced bridge 410 comprises two resistors R1 and R2 coupled in series and is employed to modify the potential levels at nodes 430 and 432. In this manner, the potential levels supplied to the poles of the bipolar ESC chuck are adjusted responsive to the approximated wafer d.c. bias voltage $V_{DC-WA}$.

For example, if the approximated wafer d.c. bias voltage $V_{DC-WA}$ is around −100 volts, the potential levels supplied by d.c. voltage source Vs to the negative and positive poles of bipolar ESC chuck 302 (i.e., base portion 306 and donut portion 304 in FIG. 4) are preferably reduced by the same magnitude, i.e., 100 volts. Thus the potential differences between the poles and their respective overlaying wafer regions remain substantially unchanged irrespective of the d.c. bias level of the wafer.

Voltage source Vs is coupled in parallel to balanced bridge 410 and represents a d.c. voltage source for supplying the d.c. biasing potential levels to the poles of the bipolar ESC chuck 302. To protect voltage source Vs from the RF energy supplied by RF generator 420, RF filters 417 and 418 of a conventional nature are provided as shown. Analogously, d.c. blocking capacitors 421 and 422 are provided to prevent RF generator 420 from being affected by the d.c. potential levels supplied by variable ESC power supply 412. The RF match circuit 424 is of a conventional design and may be coupled between RF generator 420 and bipolar ESC chuck 302 to provide impedance matching.

It should be noted that although variable ESC power supply 412 is implemented herein by a balanced bridge coupled in series with a d.c. supply source, other conventional variable d.c. power supplies that can modify their outputs responsive to a d.c. input signal may well be employed.

In another configuration, the resistors forming balanced bridge 410, e.g., resistors R1 and R2 of FIG. 4, may be unbalanced, i.e., unequal in value, to supply the chuck poles with potential levels that are not only opposite in polarity but also unequal in magnitudes. The ability to vary the relative potential levels supplied to the chuck poles represents another parameter that may be controlled and adjusted to obtain the desired wafer clamping force.

Figure 1A:
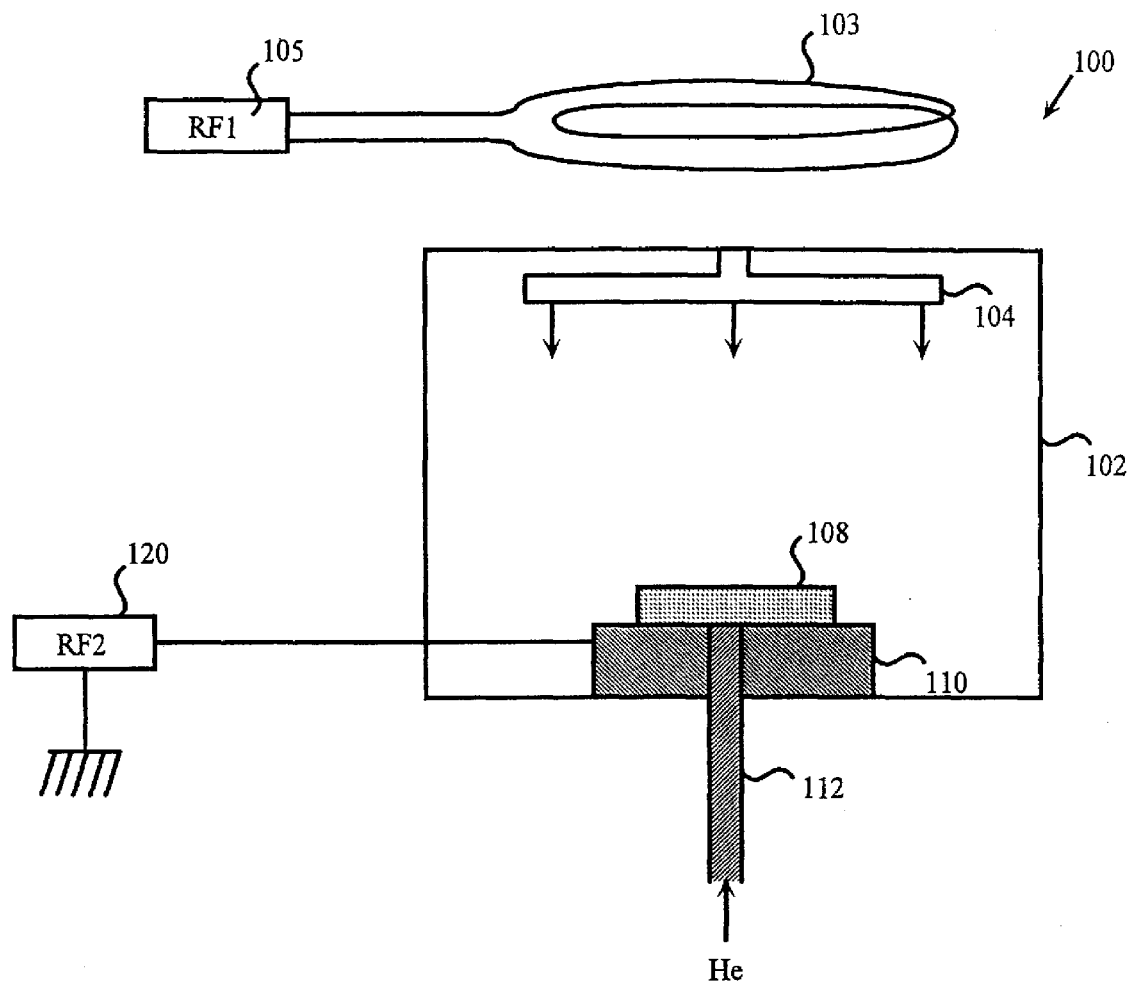
FIGS. 1A and 1B illustrate prior art representative, simplified representative, simplified plasma-enhanced processing system.
Figure 1B:
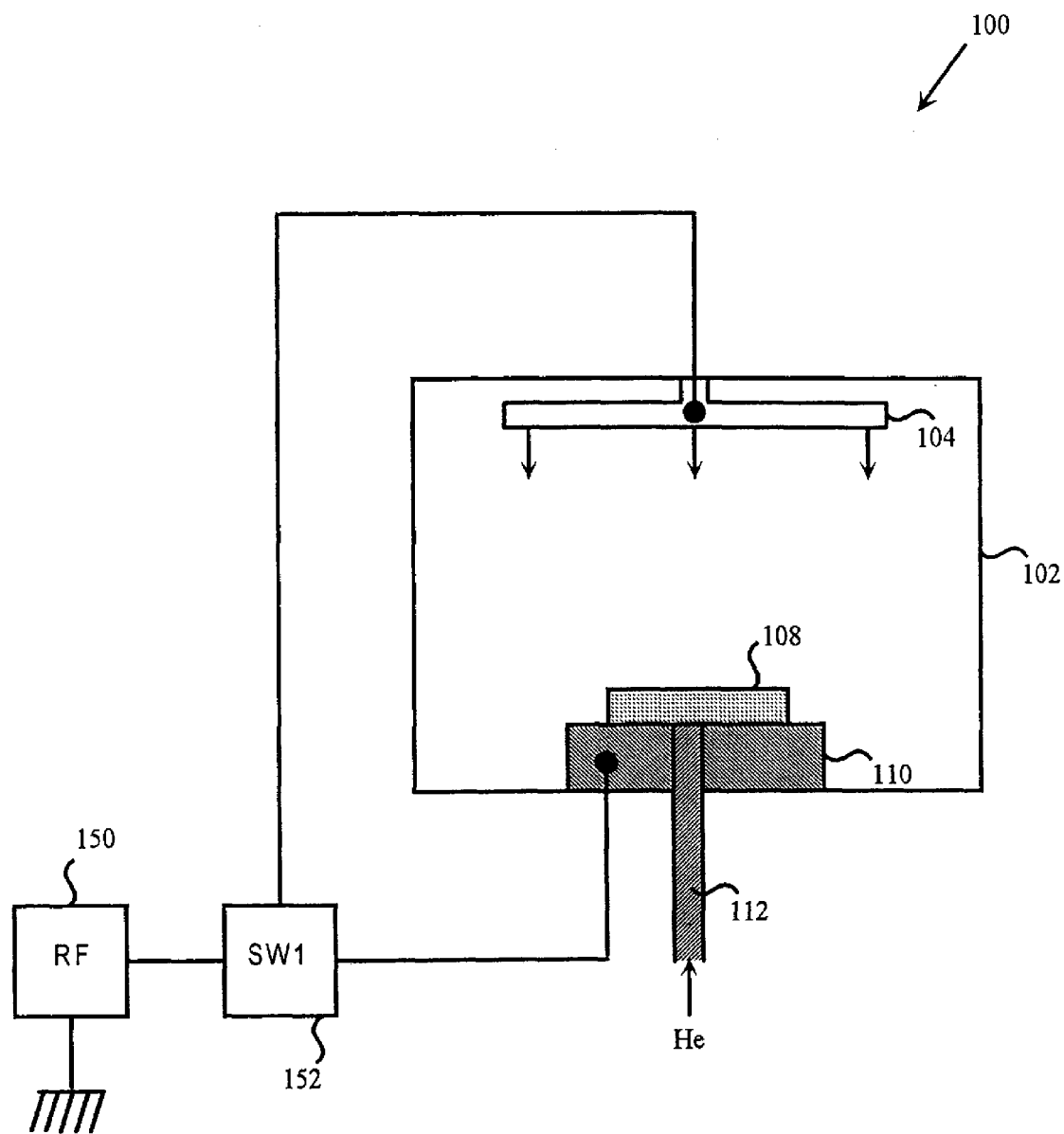
Figure 2:
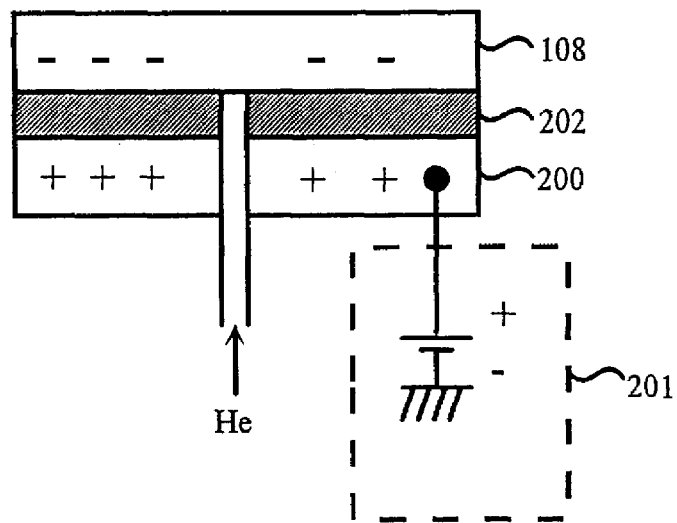
FIG. 2 illustrates a simple monopolar electrostatic chuck.
Figure 3A:
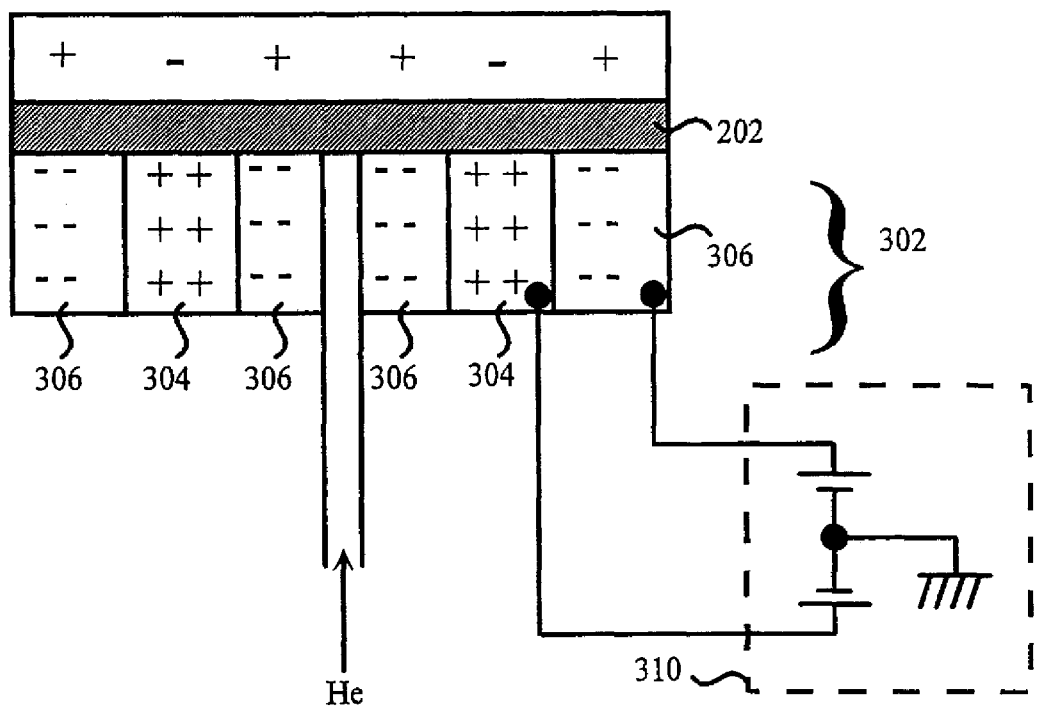
FIG. 3A is a cross-sectional illustration of a bipolar electrostatic chuck.
Figure 3B:
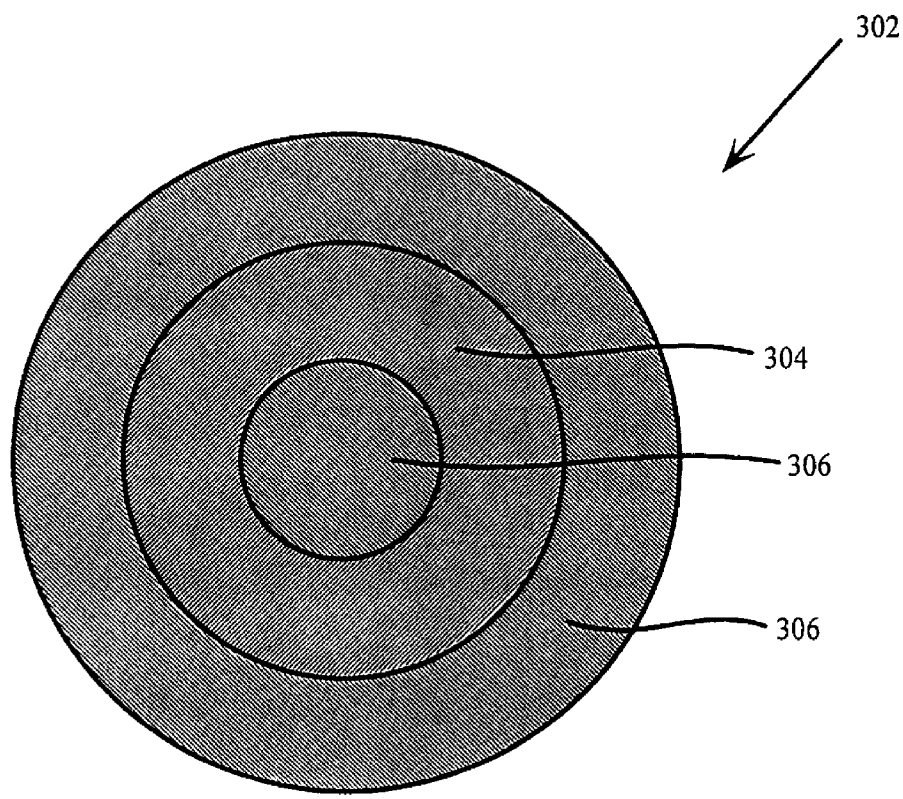
FIG. 3B illustrates a donut-and-base configuration of a bipolar electrostatic chuck.
Figure 5A:
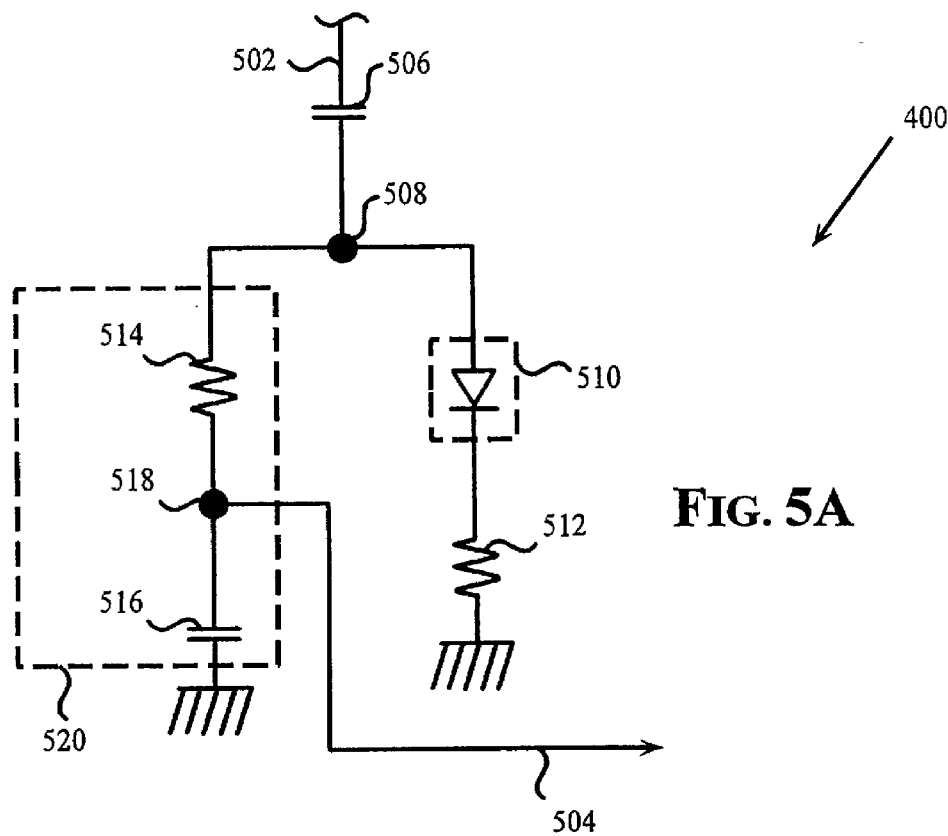
FIG. 5A shows one implementation of the wafer bias sensor.

FIG. 5A shows one implementation of wafer bias sensor 400 of FIG. 4, which performs negative peak detection on the a.c. signal obtained on bipolar ESC chuck 302 to infer the wafer d.c. bias voltage. It should be borne in mind that the particular implementation shown in FIG. 5A is only exemplary and conventional circuits exist for performing similar negative peak detection task. Since wafer bias sensor 400 is designed to perform negative peak detection on the a.c. RF signal, its components are preferably selected to handle the high voltage, high frequency a.c. signal measured.

Referring now to FIG. 5A, wafer bias sensor 400 receives the RF peak-to-peak a.c. signal $V_{PK-PK}$ measured on the chuck through conductor 502 and outputs the approximated wafer d.c. bias voltage $V_{DC-WA}$ to the variable electrostatic chuck power supply through conductor 504. A d.c. blocking capacitor 506 decouples the d.c. voltage level on conductor 502 from conductor 508.

The peak-to-peak information seen on conductor 502 is also present at node 508. Compared to the waveform seen on conductor 502, however, the waveform seen at node 508 is shifted downward by a value whose magnitude approximately equals the magnitude of the RF peak voltage (i.e., ½ the RF peak-to-peak voltage) minus the magnitude of the forward bias voltage of diode module 510. By way of example, if the RF peak-to-peak voltage is about 700 volts and the forward bias voltage of diode module 510 is about 30 volts, the aforementioned downward shift magnitude is about 320 volts (about ½ of 700 volts−30 volts).

Diode module 510 is coupled in parallel with RC circuit 520 and preferably represents a plurality of diodes coupled in series, whose aggregate forward bias voltage approximates the plasma potential, $V_{PL}$. The use of multiple diodes in series is useful to enable diode module 510 to withstand the high voltage peaks that are present at node 508. In one example, this aggregate forward bias voltage value is approximately 30 volts, which satisfactorily approximates the plasma voltage $V_{PL}$ to the first order. The diode(s) within diode module 510 are preferably selected to be low in capacitance to prevent the formation of a capacitive voltage division circuit and to ensure accurate peak detection of the a.c. signal at node 508. In one embodiment, diode module 510 comprises about 42 diodes in series, each having a capacitance value of about 2–4 pF. Preferably, diode module 510 has an aggregate capacitance value of less than about 4 pF, and more preferably about 0.5 pF. Further, diode module 510 preferably has a response time of less than about 15 nanoseconds to minimize phase shifting in the a.c. signal at node 508, which introduces errors into the peak detection circuitry. Additionally, each diode in the diode module is preferably coupled in parallel with a voltage balancing resistor, which may have a carbon composition. Further, the voltage balancing resistors preferably have low parasitic capacitance, e.g., less than 2 pF in one case, and low parasitic inductance, e.g., less than 30–50 nH. When the diodes are coupled in series in a diode module, the voltage balancing resistors are thereby coupled in series to evenly distribute the reverse voltage across the diodes to prevent diode reverse breakdown due to excessive reverse voltage.

Resistor 512 is shown coupled between diode module 510 and ground to limit the current surge into diode module 510 and is selected to provide a time constant for charging capacitor 506. In one example, the value of resistor 512 is chosen such that capacitor 506 can be charged in about 800 nanoseconds.

To obtain the d.c. information from the waveform presented at node 508, a low pass filter is employed. In the preferred embodiment, this low pass filter is implemented by RC network 520, which comprises a resistor 514 and a capacitor 516. Since the signal at node 508 is a relatively high voltage a.c. signal, resistor 514 is preferably a low-inductance resistor to minimize power dissipation and to prevent parallel resonance. In one embodiment, resistor 514 has an inductance of below about 50 nH, for example.

Further, resistor 514 is preferably a high-voltage, high-power resistor to withstand the full peak-to-peak voltage at node 508. By way of example, a resistor having a voltage rating of above about 3 Kvolts and preferably at about 6 Kvolts may be suitable. The power rating of this resistor 514 is, in one embodiment, about 15 watts.

In between resistor 514 and capacitor 516, node 518 is coupled to conductor 504 to provide the negative d.c. voltage that approximates wafer d.c. bias voltage, i.e., $V_{DC-WA}$, to the variable ESC chuck power supply, e.g., to balanced bridge 410 of ESC power supply 412 of FIG. 4.

In this manner, the invention advantageously detects the RF peak-to-peak voltage from the ESC chuck and infer therefrom the approximate d.c. bias level of the wafer. This inferred approximate d.c. bias level is then used as a feedback voltage to modify the potential levels supplied by the variable ESC chuck power supply to dynamically account for the plasma-induced variations in the wafer d.c. bias level, i.e., the variations in the d.c. voltage level of the wafer under different plasma conditions.

Because of the dynamic feedback feature, relatively constant potential differences are maintained between the poles of the ESC chuck and their overlaying wafer regions during process runs. Thus, the holding force between the chuck and the wafer should fall within a tight tolerance so as to reduce the possibility of arcing or dechucking.

Figure 5B:
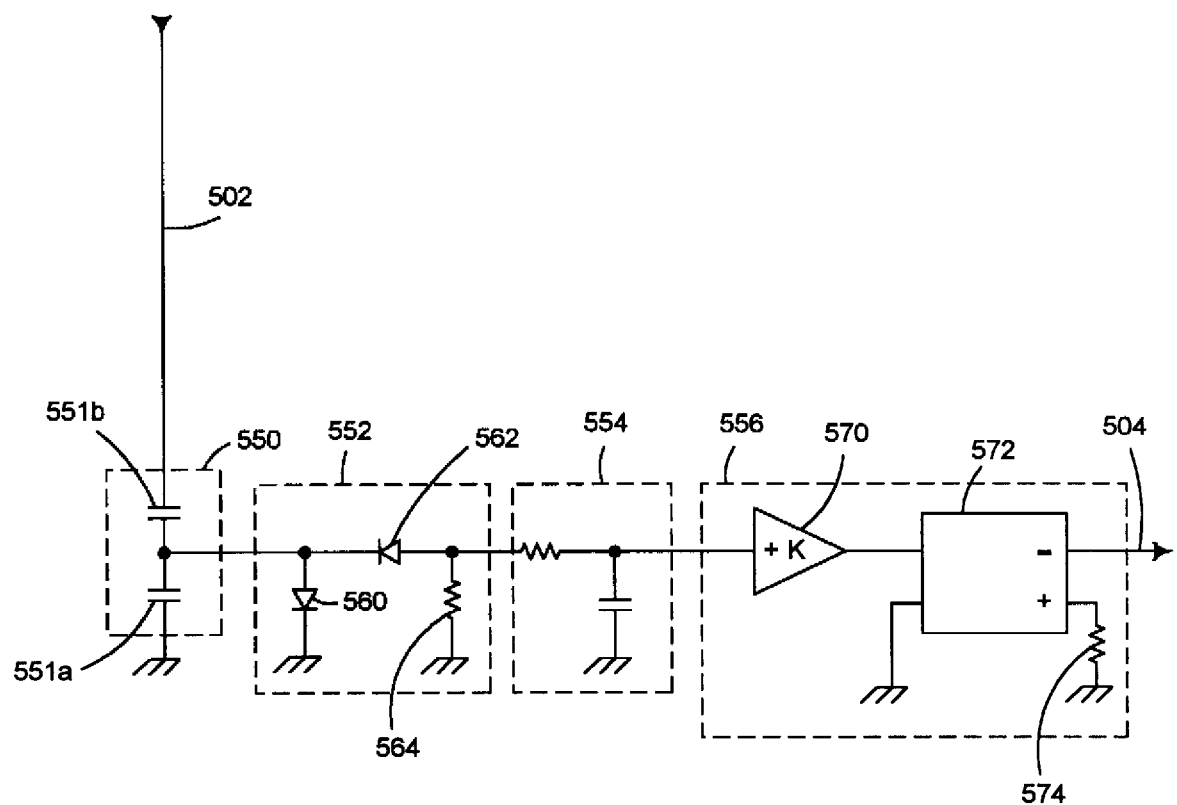
FIG. 5B illustrates another implementation of the wafer bias sensor.

FIG. 5B illustrates another implementation of wafer bias sensor 400 of FIG. 4. Conductor 502 supplies the RF peak-to-peak a.c. signal $V_{PK}$-$V_{PK}$ measured on the chuck to the wafer bias sensor of FIG. 5B. The approximated wafer d.c. bias voltage $V_{DC-WA}$ is output to the variable electrostatic chuck power supply, e.g., variable electrostatic chuck power supply 412 of FIG. 4, through conductor 504.

In the wafer bias sensor implementation of FIG. 5B, circuit block 550 represents an RF signal reduction block, preferably a 100:1 capacitive division circuit with the value of capacitor 551a being about 99 times the value of capacitor 551b. Circuit block 552 represents a negative peak detector circuit, preferably comprising two fast diodes (560 and 562) and a resistor 564 in the configuration shown. Circuit block 554 is a filter for obtaining a d.c. signal from the output of the negative peak detector circuit of circuit block 552. In the embodiment of FIG. 5B, circuit block 554 is implemented by an RC filter.

Circuit block 556 is a signal amplification circuit to amplify the small d.c. signal output by the filter of circuit block 554. In this embodiment, circuit block 556 provides a gain of 100:1 and comprises a buffer circuit 570 coupled in series with a high voltage variable floating power supply 572. It should be borne in mind that the reduction value of circuit block 550 and the concomitant amplification value of circuit block 556 are not limited to the preferred values specified herein and may be varied as appropriate. The positive terminal of high voltage variable floating power supply 572 may be coupled directly to ground or optionally via a resistor 574 to limit the leakage current. The output of circuit block 556 is then provided to the variable electrostatic chuck power supply, e.g., power supply 412 of FIG. 4, via conductor 504.

Figure 6A:
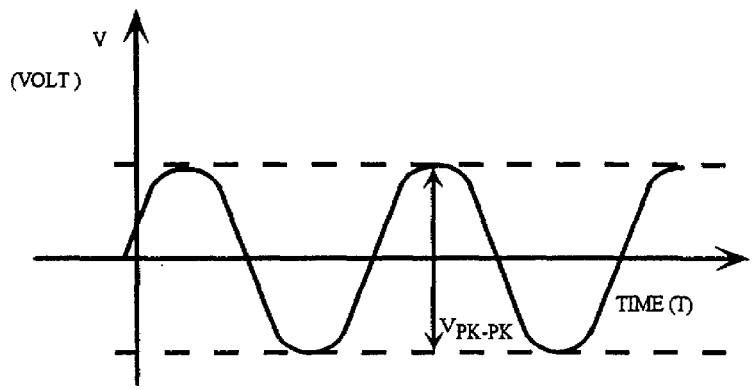
FIGS. 6A, 6B, 7 and 8 are graphs illustrating the signal measured at different points in the wafer bias sensor of FIG. 5A.
Figure 6B:
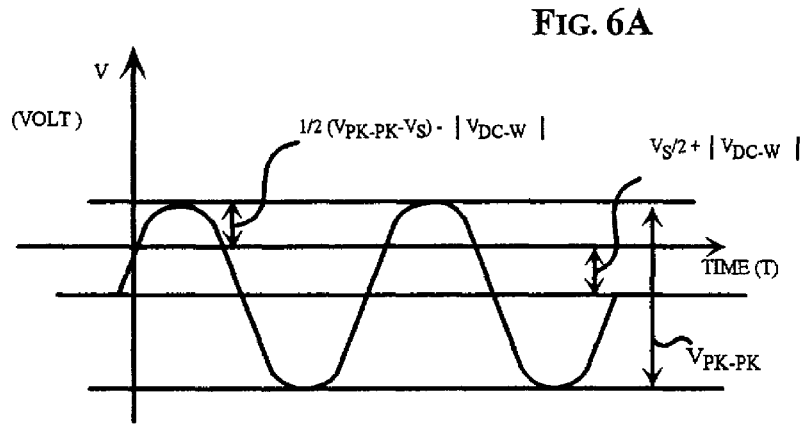

To further illustrate the present invention, FIG. 6A is a graph illustrating the a.c. RF signal measured at point 423 of FIG. 4. The peak-to-peak information is contained in this waveform and labeled in FIG. 5A by $V_{PK-PK}$. Note that the waveform is substantially symmetrical about the horizontal 0 volt line of the voltage axis because the d.c. component has been removed by d.c. blocking capacitors, e.g., capacitors 421 and 422 of FIG. 4. FIG. 6B is a graph illustrating the a.c. RF signal measured on the ESC chuck, e.g., at point 402 of FIG. 4. The waveform shown in FIG. 6B has substantially the same shape and peak-to-peak voltage ($V_{PK-PK}$) as that of FIG. 6, albeit shifted downward by approximately one-half the value of the supply voltage Vs plus the magnitude of the wafer d.c. bias, i.e., shifted down by about $Vs/2+|V_{DC-W}|$.

Figure 7:
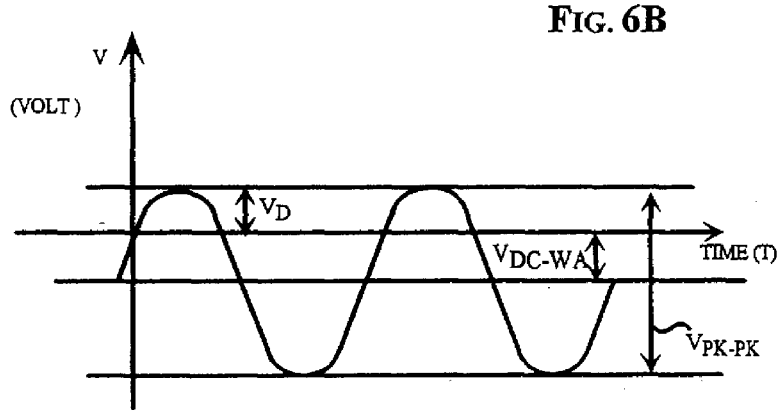

FIG. 7 is a graph illustrating the a.c. RF signal obtained at node 508 of the negative peak detector of FIG. 5A. The waveform shown in FIG. 7 has substantially the same shape and peak-to-peak voltage ($V_{PK-PK}$) as that of FIG. 6, albeit shifted downward by approximately the value of the peak voltage (i.e., ½ of the RF peak-to-peak voltage) minus the magnitude of the forward bias voltage of the diode module, $V_D$. Thus, the portion of the waveform above 0 volt represents approximately the forward bias voltage of the diode module and is labeled $V_D$ in FIG. 7. In one embodiment, the forward bias voltage of diode module 510 is chosen to approximate the plasma voltage $V_{PL}$, which is about 30 volts in one case.

Figure 8:
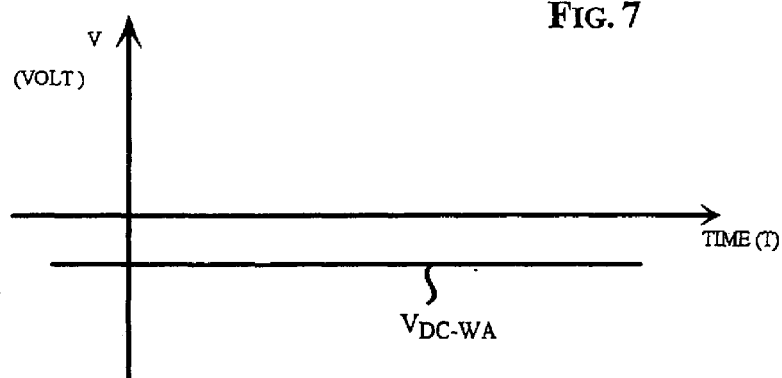

FIG. 8 shows the d.c. feedback signal output by the wafer bias sensor circuit, e.g., on conductor 504 of FIG. 5A. Note that this d.c. bias is a negative value, representing the dynamically inferred d.c. bias of the wafer. This d.c. feedback signal is the signal employed to modify the potential levels supplied to the electrostatic chuck poles.

Figure 9:
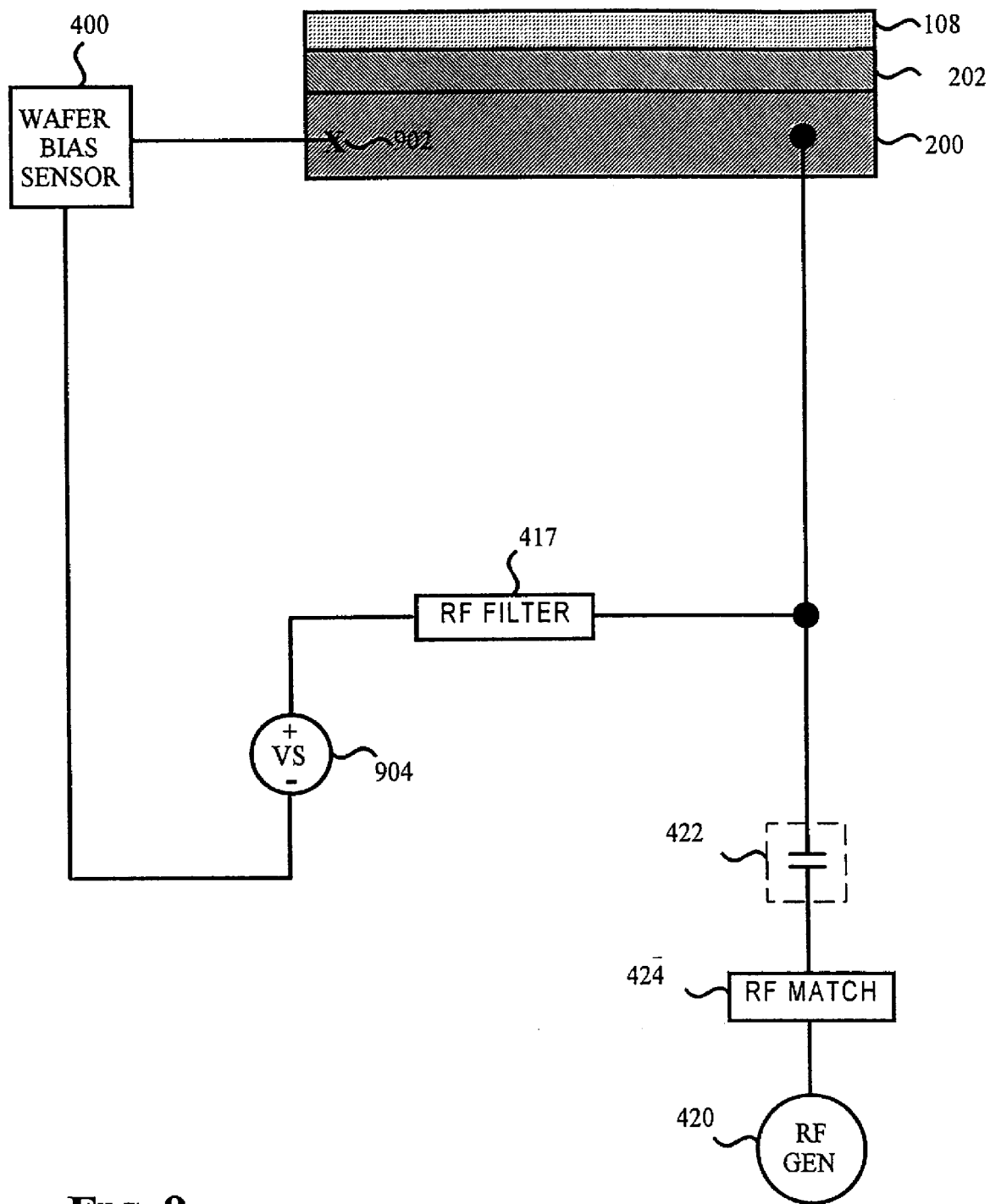
FIG. 9 schematically illustrates, in one embodiment, an exemplary embodiment of the dynamic feedback monopolar electrostatic (ESC) chuck system in accordance with one aspect of the present invention.

As mentioned earlier, the dynamic feedback concept applies equally well to monopolar electrostatic chucks. FIG. 9 schematically illustrates, in one embodiment, a monopolar chuck system employing the dynamic feedback technique of the present invention. In FIG. 9, monopolar chuck 200 is positively biased to provide the desired clamping force although, as is known, it may also be negatively biased. Modifications to the circuit of FIG. 9 to implement dynamic sensing to a negatively biased monopolar chuck is within the abilities of those skilled in the art.

Referring now to FIG. 9, wafer 108 is disposed atop dielectric layer 202 of monopolar chuck 200. The chuck's peak-to-peak voltage is detected at point 902 on the chuck and processed by wafer bias sensor (WBS) 400 to infer the approximated wafer d.c. bias voltage. Like point 402 of FIG. 4, pickup point 902 is preferably located at a chuck location that is not exposed to the plasma environment to maximize sensor survivability and minimize the risk of introducing contamination into the wafer processing chamber.

Wafer bias sensor 400 is, in one embodiment, implemented by the negative peak detection circuit of FIG. 5A. The inferred wafer d.c. bias voltage output by wafer bias sensor 400 is then employed as a feedback voltage to modify the potential level supplied by d.c. voltage source 904 to monopolar chuck 200. For example, the more negatively biased the wafer is, the more negative the inferred wafer d.c. bias voltage, which is output by wafer bias sensor 400, will become. Responsive to this inferred d.c. bias voltage, d.c. voltage source 904 will accordingly reduce the positive d.c. potential level supplied to chuck 200. RF filter 417, RF generator 422, RF match 424 and d.c. blocking capacitors have been discussed in connection with FIG. 4.

The dynamic feedback feature advantageously keeps the potential difference between the monopolar chuck and its wafer substantially unchanged from process step to process step. Consequently, the risk of inadvertently creating an excessively high potential difference between the wafer and the monopolar chuck is minimized, thereby reducing the possibility of causing dielectric breakdown damage to the dielectric layer 202 or pit mark damage (due to arcing) to either the upper surface of the chuck or the wafer.

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An electrostatic chuck system having an electrostatic chuck for securely holding a wafer on a surface of said electrostatic chuck, comprising:

a wafer bias sensor coupled to a first portion of said electrostatic chuck for dynamically sensing an alternating current signal at said first portion, said wafer bias sensor outputting, responsive to said alternating current signal, a direct current voltage level representative of a direct current bias level of said wafer; and a variable electrostatic chuck power supply coupled to said wafer bias sensor, said variable electrostatic chuck power supply providing a first potential level to said first portion of said electrostatic chuck, said first potential level being dynamically modified, responsive to said direct current voltage level, to substantially maintain a first predefined potential difference between said first portion of said electrostatic chuck and a first region of said wafer overlaying said first portion irrespective of a magnitude of said direct current bias level of said wafer.

2. The electrostatic chuck system of claim 1 wherein said electrostatic chuck further comprises a second portion electrically insulated from said first portion, said second portion being coupled to said variable electrostatic chuck power for receiving a second potential level different from said first potential level, said second potential level being adjusted, responsive to said direct current voltage level from said wafer bias sensor, to substantially maintain a second predefined potential difference between said second portion of said electrostatic chuck and a second region of said wafer overlaying said second portion irrespective of said magnitude of said direct current bias level of said wafer.

3. The electrostatic chuck system of claim 2 wherein said variable electrostatic chuck power supply comprises a balanced bridge for receiving said direct current voltage level, said balanced bridge being coupled in parallel with a direct current power supply and including a first resistor in series with a second resistor.

4. The electrostatic chuck system of claim 3 wherein said first resistor and said second resistor of said balanced bridge are chosen to be unequal in value.

5. The electrostatic chuck system of claim 1 wherein said direct current voltage level is a dynamic approximation of said direct current bias level of said wafer.

6. The electrostatic chuck system of claim 5 wherein said variable electrostatic chuck power supply represents a d.c. voltage source having a first supply node and a second supply node, said first supply node being coupled to said wafer bias sensor for receiving said direct current voltage level, said second supply node being coupled to said first portion of said electrostatic chuck.

7. The electrostatic chuck system of claim 5 wherein said wafer bias sensor is disposed at a position that does not expose said wafer bias sensor to plasma of a plasma processing chamber within which said electrostatic chuck system is employed.

8. The electrostatic chuck system of claim 1 wherein said wafer bias sensor is disposed at a position that does not expose said wafer bias sensor to plasma of a plasma processing chamber within which said electrostatic chuck system is employed.

9. A method for clamping a wafer on a surface of an electrostatic chuck, comprising:

sensing dynamically a first alternating current signal at a first portion of said electrostatic chuck;

deriving, responsive to said first alternating current signal, a direct current voltage level representative of a direct current bias level of said wafer; and modifying, in a dynamic manner and responsive to said direct current voltage level, a first potential level supplied by a direct current power supply to said first portion of said electrostatic chuck to substantially maintain a predefined potential difference between said first portion of said electrostatic chuck and a first region of said wafer overlaying said first portion irrespective of a magnitude of said direct current bias level of said wafer.

10. The method of claim 9 further comprising the step of:

modifying, responsive to said direct current voltage level, a second potential level supplied by said direct current power supply to a second portion of said electrostatic chuck, said second portion being electrically isolated from said first portion and said second potential level being different from said first potential level, to substantially maintain a predefined second potential difference between said second portion of said electrostatic chuck and a second region of said wafer overlaying said second portion irrespective of a magnitude of said direct current bias level of said wafer.

11. The method of claim 9 wherein said step of modifying said first potential level comprises the step of:

receiving said direct current voltage level using a balanced bridge, said balanced bridge being coupled in parallel with said direct current power supply and including a first resistor in series with a second resistor.

12. The method of claim 11 wherein said first resistor and said second resistor of said balanced bridge are chosen to be unequal in value.

13. The method of claim 9 wherein said direct current voltage level is a dynamic approximation of said direct current bias level of said wafer.

14. The method of claim 13 wherein modifying step comprises the step of supplying said direct current voltage level to a first supply node of said direct current power supply, thereby modifying said first potential level at a second supply node of said direct current power supply.

15. An electrostatic chuck system having an electrostatic chuck for securely holding a wafer on a surface of said electrostatic chuck, comprising:

means for dynamically sensing a first alternating current signal at a first portion of said electrostatic chuck;

means for deriving, responsive to said first alternating current signal, a direct current voltage level representative of a direct current bias level of said wafer; and means for dynamically modifying, responsive to said direct current voltage level, a first potential level supplied by a direct current power supply to said first portion of said electrostatic chuck to substantially maintain a predefined potential difference between said first portion of said electrostatic chuck and a first region of said wafer overlaying said first portion irrespective of a magnitude of said direct current bias level of said wafer.

16. The electrostatic chuck system of claim 15 wherein said modifying means further modifies, responsive to said direct current voltage level, a second potential level supplied by said direct current power supply to a second portion of said electrostatic chuck, said second portion being electrically isolated from said first portion and said second potential level being different from said first potential level, to substantially maintain a predefined second potential difference between said second portion of said electrostatic chuck and a second region of said wafer overlaying said second portion irrespective of a magnitude of said direct current bias level of said wafer.

17. The electrostatic chuck system of claim 15 wherein said modifying means comprises a balanced bridge coupled to said deriving means for receiving said direct current voltage level, said balanced bridge being coupled in parallel with a direct current power supply and including a first resistor in series with a second resistor.

18. The electrostatic chuck system of claim 17 wherein said first resistor and said second resistor of said balanced bridge are chosen to be unequal in value.

19. The electrostatic chuck system of claim 15 wherein said direct current voltage level is a dynamic approximation of said direct current bias level of said wafer.

20. The electrostatic chuck system of claim 19 wherein modifying means comprises a direct connection between said deriving means and a first supply node of said direct current power supply to modify said first potential level at a second supply node of said direct current power supply.

21. A method for clamping a substrate on a surface of an electrostatic chuck in a plasma processing chamber, comprising:

dynamically sensing a first ac signal at a first position on said electrostatic chuck, said first position being configured such that a sensor employed for said dynamic sensing is not exposed to plasma of said plasma processing chamber during substrate processing;

deriving, responsive to said first ac signal, a dc voltage level approximating a dc bias level of said substrate during said substrate processing; and modifying, in a dynamic manner and responsive to said dc voltage level, a first potential level supplied by a variable dc power supply to said electrostatic chuck to substantially achieve a desired potential difference between a first portion of said electrostatic chuck and a first region of said substrate overlaying said first portion irrespective of a magnitude of said dc bias level of said substrate during said substrate processing.

22. The method of claim 21 wherein said electrostatic chuck represents a bipolar electrostatic chuck.

23. The method of claim 21 wherein said plasma processing chamber is configured for plasma etching.

* * * * *